(12) United States Patent
Ono

(10) Patent No.: US 7,102,192 B2
(45) Date of Patent: Sep. 5, 2006

(54) SEMICONDUCTOR NONVOLATILE MEMORY CELL ARRAY

(75) Inventor: Takashi Ono, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/063,858

(22) Filed: Feb. 24, 2005

(65) Prior Publication Data
US 2006/0006457 A1    Jan. 12, 2006

(30) Foreign Application Priority Data
Jul. 9, 2004  (JP)  ............................. 2004-203901

(51) Int. Cl.
H01L 29/788 (2006.01)
H01L 29/792 (2006.01)

(52) U.S. Cl. .................... 257/316; 257/324; 438/954

(58) Field of Classification Search ................ None
See application file for complete search history.

(56) References Cited

U.S. PATENT DOCUMENTS 6,434,053 B1    8/2002   Fujiwara 7,015,535 B1 *  3/2006   Ono et al. .................. 257/314

FOREIGN PATENT DOCUMENTS

JP    5259410    10/1993

* cited by examiner

Primary Examiner—David Nelms
Assistant Examiner—Hoang-Quan Ho
(74) Attorney, Agent, or Firm—Takeuchi & Kubotera, LLP

(57) ABSTRACT

A semiconductor nonvolatile memory cell array includes a plurality of semiconductor nonvolatile memory cells. Each memory cell has a control electrode (30); a pair of impurity diffusion regions (21, 22) to provide first and second main electrodes; a pair of variable resistance sections (24, 26); and a pair of charge storage sections (50, 52). The array has a word line (33) electrically connected to the control electrodes of the semiconductor nonvolatile memory cells and bit lines provided perpendicular to the word line and composed of the impurity diffusion regions; and layer insulation layers (57, 58) provided between the charge storage sections and the word line.

6 Claims, 12 Drawing Sheets

SEMICONDUCTOR NONVOLATILE MEMORY CELL ARRAY

BACKGROUND OF THE INVENTION

1. Field of the Invention

The present invention relates to a semiconductor nonvolatile memory cell array and a process for producing the same and, particularly, to a semiconductor nonvolatile memory cell array composed of semiconductor nonvolatile memory cells that have simple memory operations and are produced at low costs.

2. Description of the Related Art

The semiconductor nonvolatile memory, which needs no power to retain stored information, is used as a memory for a low power device, such as a cell phone. A structure having a metal oxide nitride oxide semiconductor (MONOS) type memory cell with at least two gate electrodes has been proposed. See U.S. Pat. Nos. 5,408,115 and 6,255,166. The MONOS type memory cell has in the channel forming region a transistor with a gate insulating film or layer made of an oxide nitride oxide (ONO) laminated insulating film or layer in which charge can accumulate in addition to a transistor with an ordinary gate insulating film.

However, in the above semiconductor nonvolatile memory, it is necessary to optimize the respective channel densities in the channel forming regions formed under the ONO laminated insulation layer and the gate insulation layer. Where separate voltages are applied to the two gate electrodes, the corresponding peripheral circuits, such as voltage generators and decoders, are required, resulting in the complicated structure. In addition, the mechanism for operating the memory becomes complicated, and it is difficult to inject charge into the ONO laminated insulation layer in simple and effective manner. Since the memory has at least two gate electrodes and the associated gate insulation layers including the ONO laminated insulation layers, the memory cell structure becomes so complex that the manufacturing cost becomes high.

SUMMARY OF THE INVENTION

Accordingly, it is an object of the invention to provide a semiconductor nonvolatile memory cell array enabling to operate the memory cell by a simple method and produce it at the low production cost.

It is another object of the invention to provide a semiconductor nonvolatile memory cell array capable of providing a sufficient gap between the charge storage sections to provide a reliable semiconductor nonvolatile memory cell array.

According to the invention there is provided a semiconductor nonvolatile memory cell array which includes a plurality of semiconductor nonvolatile memory cells, each including a semiconductor substrate of a first conductive type; a control electrode provided on the semiconductor substrate via an insulation layer; a pair of impurity diffusion regions of a second conductive type provided on the semiconductor substrate on opposite sides of the control electrode to provide first and second main electrodes; a channel region provided on the semiconductor substrate below the control electrode at a time of transistor operation; a pair of variable resistance sections of a second conductive type provided between the channel region and the impurity diffusion regions, respectively, and having an impurity density lower than that of the impurity diffusion regions; and a pair of charge storage sections provided one on each of the variable resistance sections; at least one word line electrically connected to the control electrodes of the semiconductor nonvolatile memory cells; at least one bit line provided perpendicular to the word line and composed of the impurity diffusion regions; and at least one layer insulation layer provided between the charge storage sections and the word line.

Since the layer insulation layer is provided between the charge storage sections and the word line, the space provided between the variable resistance sections and the word line is so large that the parasitic capacitance produced between the variable resistance sections and the word line is minimized. Consequently, writing and reading information from the semiconductor nonvolatile memory cell can be made at high speeds. The potential change of the word line when information is read from the semiconductor nonvolatile memory cell has little influence on the variable resistance sections and the charge storage sections provided on the variable resistance sections. As a result, the danger that the information once written in the semiconductor nonvolatile memory cell is read out by error is minimized.

DESCRIPTION OF THE PREFERRED EMBODIMENTS

First Embodiment

The structure of a semiconductor nonvolatile memory cell according to the first embodiment of the invention will now be described with reference to FIGS. 1 and 2.

Figure 1:
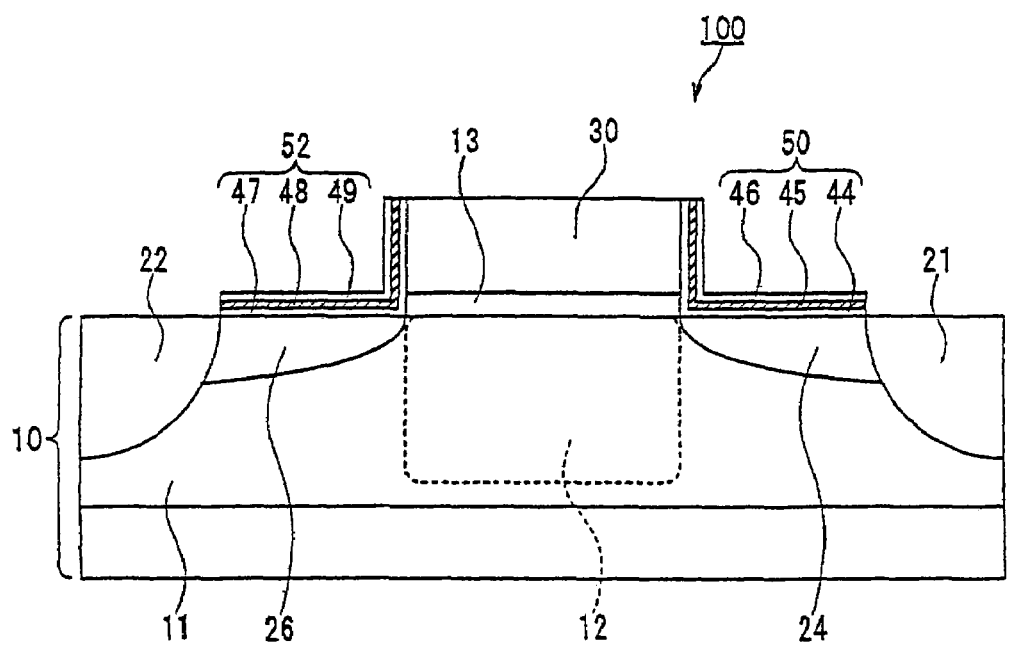
FIG. 1 is a sectional view of a semiconductor nonvolatile memory cell according to the first embodiment of the invention.

In FIG. 1, the semiconductor nonvolatile memory cell includes a p-type silicon substrate 10, a P well 11 formed on the silicon substrate 10, separate drain and source regions 21 and 22 made of N+ diffusion layers in the P well 11, and a channel forming region 12 between them. A gate insulation layer 13 is formed on the channel forming region 12, and a gate electrode 30 is formed on the gate insulation layer 13.

The first variable resistance section 24 is provided between the drain region 21 and the channel forming region 12. The first silicon oxide layer 44, a silicon nitride layer 45, and the second silicon oxide layer 46 are provided on the first variable resistance section 24 to form the first charge storage section 50. The second variable resistance section 26 is provided between the source region 22 and the channel forming region 12. The first silicon oxide layer 47, a silicon nitride layer 48, and the second silicon oxide layer 49 are provided on the second variable resistance section 26 to form the second charge storage section 52.

Information is recorded by injecting hot carriers into the first or second charge storage section 50 or 52 for charge accumulation. That is, the absence or presence of charge accumulation is made correspondent to "0" or "1" to record one bit of information. Whether charge is accumulated in the first charge storage section 50 is determined by making use of the following phenomenon. Where charge is accumulated in the first charge storage section 50, the resistance value of the first variable resistance section 24 rises, resulting in the reduced current. Where no charge is accumulated in the first charge storage section 50, the resistance value of the first variable resistance section 24 is sufficiently low to conduct electric current.

Similarly, information is recorded in the second charge storage section 52. Thus, two bits of information can be written and read out of one semiconductor nonvolatile memory cell. As a result, the information storage density per unit area can be increased in a semiconductor nonvolatile memory cell array. Consequently, the manufacturing cost of a memory cell array for recording the same amount of information can be reduced.

Figure 2:
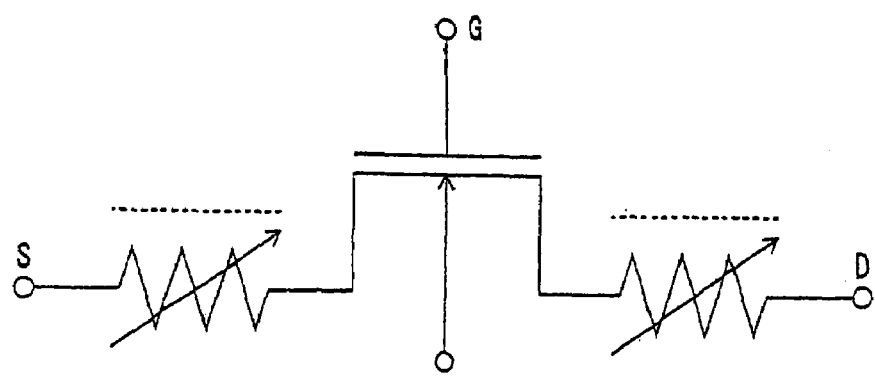
FIG. 2 is an equivalent circuit of the memory cell.

In FIG. 2, two variable resistors in the equivalent circuit correspond to the variable resistance sections 24 and 26 provided on both sides of the gate electrode. In the following description, "word line" means a control signal line for selecting one row of memory cells in the two-dimensional memory cell array. A memory cell is disposed at an intersection between the word line and the hereinafter defined bit line, and writing or reading is made by raising the voltage of the word line corresponding to the address at which the writing or reading is made. "bit line" is a signal line disposed in the direction perpendicular to the word line for reading information out of the memory cell. The memory cell connected to the word line of the raised voltage outputs to the bit line the information stored therein (one bit of information determined by whether charge is accumulated) for performing readout.

Figure 3:
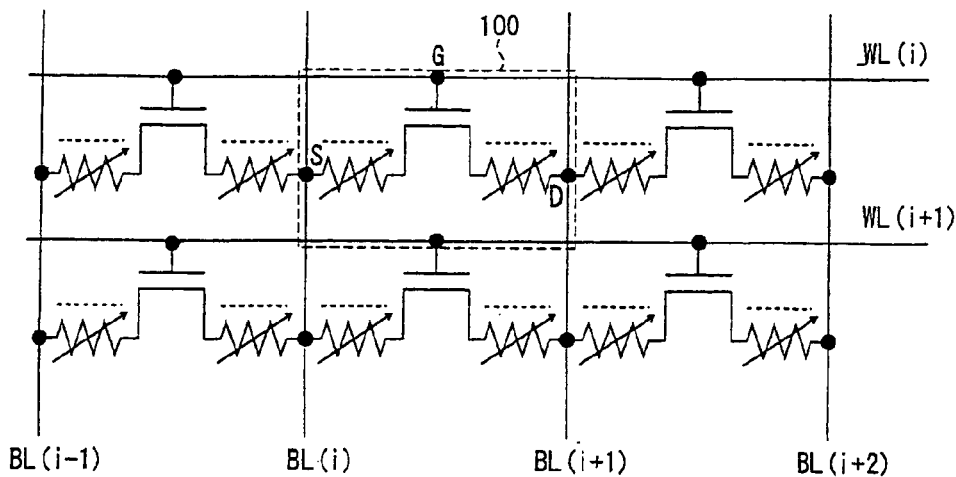
FIG. 3 is a circuit diagram of a semiconductor nonvolatile memory cell array according to the first embodiment of the invention.

In FIG. 3, the gate electrode (G) of a memory cell 100 is connected to a word line WL(i) disposed in the direction of rows (hereinafter "first direction"), wherein i is a natural number. The source region (S) and the drain region (D) are connected to bit lines BL(i) and BL(i+1), respectively, disposed in the direction perpendicular to the first direction (hereinafter "second direction"), wherein i is a natural number. Consequently, the bit line to which the source region (S) of the memory cell 100 is connected is shared by the drain region (D) of the memory cell in the adjacent column. Consequently, the control line structure for driving the memory cells is simplified, resulting in the reduced area of the memory cell array, and the parasitic resistance is reduced by that much.

Figure 4:
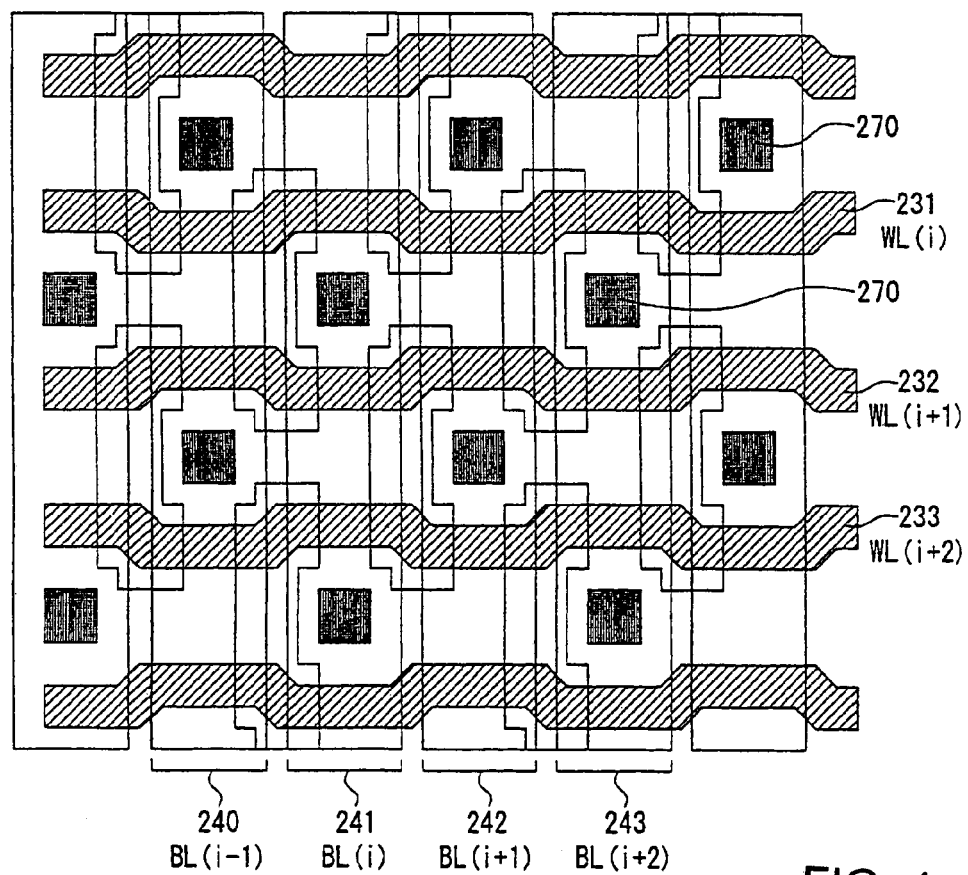
FIG. 4 is a plan view of a conventional semiconductor nonvolatile memory cell array.

In FIG. 4, the word lines WL(i) 231, WL(i+1) 232, WL(i+2) 233, etc. are shown with shading. The bit lines BL(i−1) 240, BL(i) 241, BL(i+1) 242, BL(i+2) 243, etc. are shown with elongated rectangles. The word lines and the bit lines are formed on different metal wiring layers. Contact holes 270 are provided above the drain and source regions 21 and 22. Electrodes are formed on the drain and source regions 21 and 22 and connected to the bit lines BL(i−1) 240, BL(i) 241, BL(i+1) 242, BL(i+2) 243 via the contact holes 270 so that in order to prevent short circuit, it is necessary to provide a certain space between the contact holes 270 and the word lines WL(i) 231, WL(i+1) 232, WL(i+2) 233 formed on the metal layer through which the contact holes 270 pass. The reflection rate of the wiring metal is so high that it is difficult to provide a large bit line width and gap. In other words, it is difficult to reduce by photolithography the width of a metal wiring and the gap between metal wirings.

Second Embodiment

A semiconductor nonvolatile memory cell array according to the second embodiment of the invention will now be described with reference to FIGS. 5–8.

Figure 5:
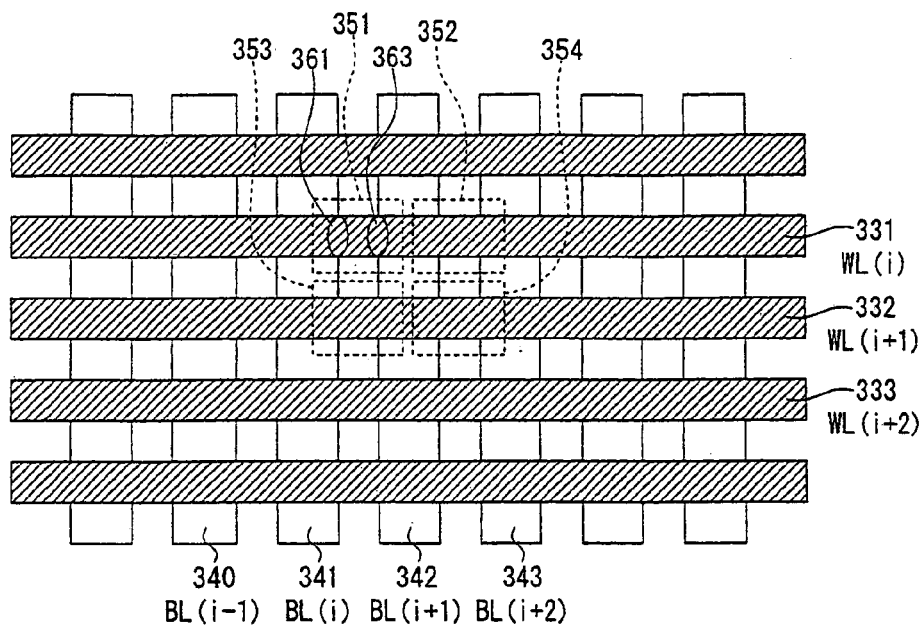
FIG. 5 is a plan view of a semiconductor nonvolatile memory cell array according to the second embodiment of the invention.

In FIG. 5, a semiconductor nonvolatile memory cell array has a two dimensional arrangement of semiconductor nonvolatile memory cells (hereinafter "memory cells"). The memory array has a plurality of bit lines, such as BL(i−1) 340, BL(i) 341, BL(i+1) 342, and BL(i+2) 343, arranged in columns and a plurality of word lines, such as WL(i) 331, WL(i+1) 332, and WL(i+2) 333, arranged in rows.

A plurality of memory cells 351, 352, 353, and 354 are made so as to be connected to one word line and adjacent two bit lines. For example, the memory cell 351 is made so as to be connected to the word line WL(i) 331 and the bit lines BL(i) 341 and BL(i+1) 342, the memory cell 352 to the word line WL(i) 331 and the bit lines BL(i +1) 342 and BL(i+2) 343, the memory cell 353 to the word line WL(i+1) 332 and the bit lines BL(i) 341 and BL(i+1)342, and the memory cell 354 to the word line WL(i+1) 332 and the bit lines BL(i+1) 342 and BL(i+2) 343. The memory cell 351 has charge accumulation areas 361 and 362. The memory cell 351 is made such that the bit lines BL(i) 341 and BL(i+1) 342 become source and drain regions, respectively, and the word line WL(i) 331 comes into contact with the gate electrode.

Figure 6:
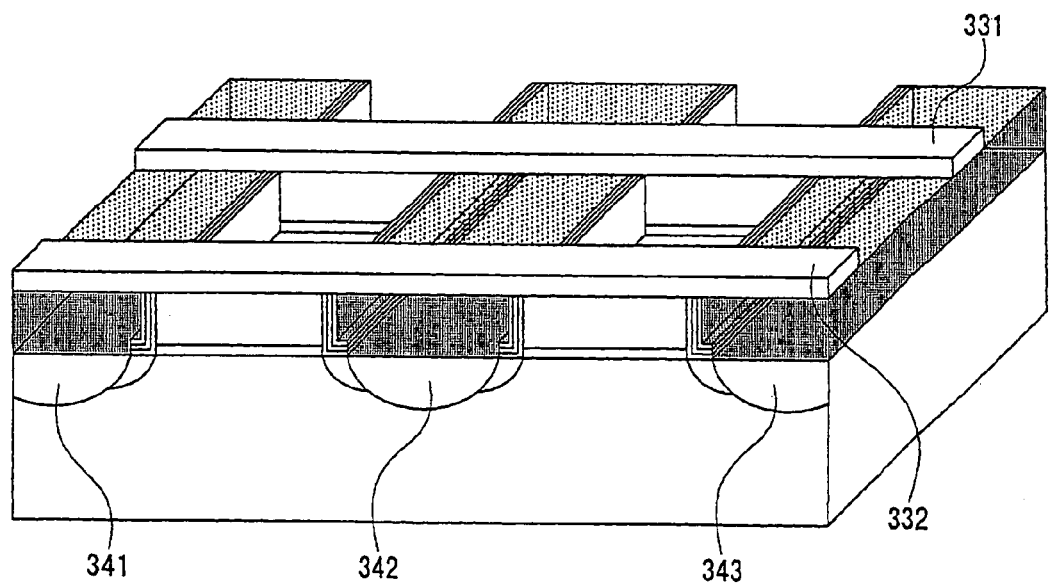
FIG. 6 is a perspective view of the semiconductor nonvolatile memory cell array of the second embodiment.

In FIG. 6, the drain and source regions of the memory cells arranged in the same column are extended in the column direction for use as the bit lines BL(i) 341, BL(i+1) 342, and BL(i+2) 343. The drain region of a memory cell and the source region of another memory cell in the same row but adjacent columns share a common region to form a bit line.

Figure 7:
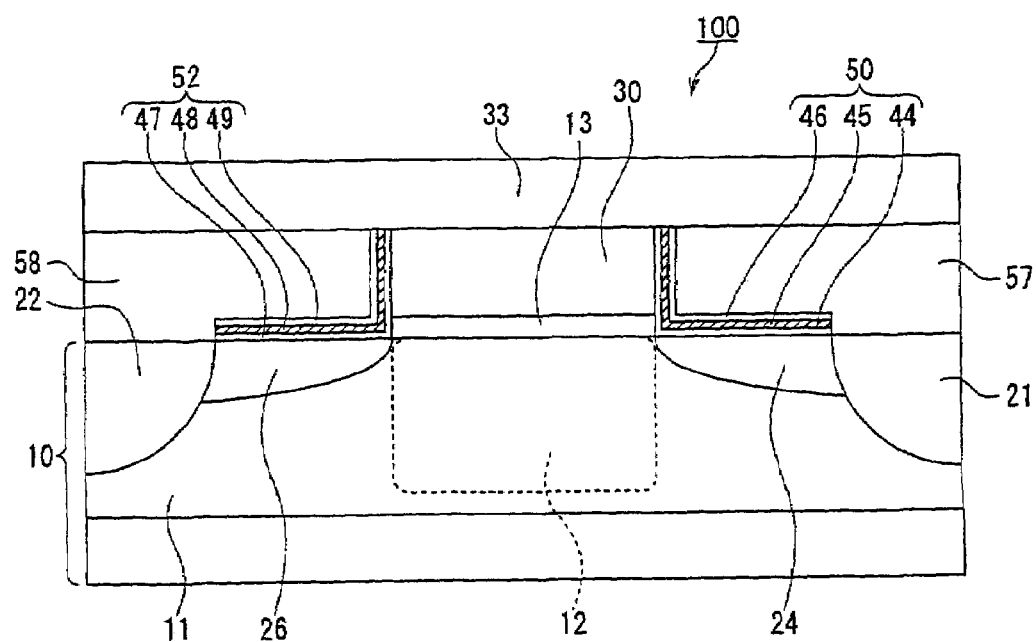
FIG. 7 is a sectional view of the semiconductor nonvolatile memory cell array of the second embodiment.

In FIG. 7, the memory cell 100 is an n-type metal oxide semiconductor field effect transistor (NMOSFET). A P well 11 is formed on a surface region of a p-type silicon substrate 10. A pair of impurity diffusion regions containing a high density of n-type impurity (N+ type) are spaced by a predetermined distance on the surface region of the P well 11 to provide a drain electrode region (merely "drain region") 21 as the first main electrode and a source electrode region (merely "source region") 22 as the second main electrode.

A control or gate electrode 30 is formed on the p-type silicon substrate 10 between the drain and source regions 21 and 22 via the first or gate insulation layer (hereinafter "insulation layer") 13. The surface region of the P well 11 between the drain and source regions 21 and 22 becomes a channel region 12 which forms a current path at a time of the NMOS operation. The gate insulation layer 13 is a silicon oxide layer (SiO2) and the gate electrode 30 is a polycrystalline silicon. The NMOS structure is well known and its description will be omitted.

The first variable resistance section 24 is provided between the drain region 21 and the channel region 12 so as to come into contact with the drain region 21. The second variable resistance section 26 is provided between the source region 22 and the channel region 12 so as to come into contact with the source region 22.

The first and second variable resistance sections 24 and 26 are made as a region of an n-type impurity density (N–type) lower than those of the adjacent drain and source regions 21 and 22 in order to concentrate electric field on the vicinity of the first and second variable resistance sections 24 and 26 for selectively injecting charge into the hereinafter described first and second charge storage section 50 and 52. Thus, it is possible to concentrate the generation of hot carrier on the first and second variable resistance sections 24 and 26. The impurity density and dimensions (width and depth) of the first and second variable resistance sections 24 and 26 can be set according to the purpose and/or design.

The first and second charge storage sections 50 and 52 are provided on the first and second variable resistance sections 24 and 26, respectively. The charge storage section may extend over the drain and source region 21 or 22. The first and second charge storage sections 50 and 52 are made of an oxide nitride oxide (ONO) laminated insulation layer. The first charge storage section 50 is made by successively laminating the first silicon oxide layer 44, a silicon nitride (SiN) layer 45, and the second silicon oxide layer 46 on the first variable resistance section 24 and has a stable charge storage function. Similarly, the second charge storage section 52 is made by successively laminating the second variable resistance section 26, the first silicon oxide layer 47, a silicon nitride layer 48, and the second silicon oxide layer 49 on the variable resistance section 26.

The hot carriers injected from the first and second variable resistance sections 24 and 26 are stored mainly in the silicon nitride layers 45 and 48 of the ONO laminated insulation layers. The charge storage sections are selected according to the purpose and/or design of the memory. For example, at least one of a silicon nitride layer, an aluminum oxide (Al2O3) layer, and a hafnium oxide (HfOx) layer is provided between the first and second oxide layers such as silicon oxide layers. The first and second charge storage sections 50 and 52 are formed on both side walls of the gate electrode 30 and the first and second variable resistance sections 24 and 26, respectively, thereby assuring the storage and retention of the injected charge. The variable resistance section and the charge storage section may be provided between the channel forming region 12 and one of the drain region 21 and the source region 22, but it is possible to write two bits of information per memory cell by providing them on both sides of the drain region 21 and the source region 22.

A word line 33 is provided on the gate electrode 30. The first and second layer insulation layers 57 and 58 are provided between the word line 33 and the first and second charge storage sections 50 and 52. The top surface of the gate electrode 30 is flush with the top surfaces of the first and second layer insulation layers 57 and 58, forming a continuous plane on which the wiring layer including the word line 33 is provided. As described above, the drain and source regions 21 and 22 are used as bit lines.

Figure 8:
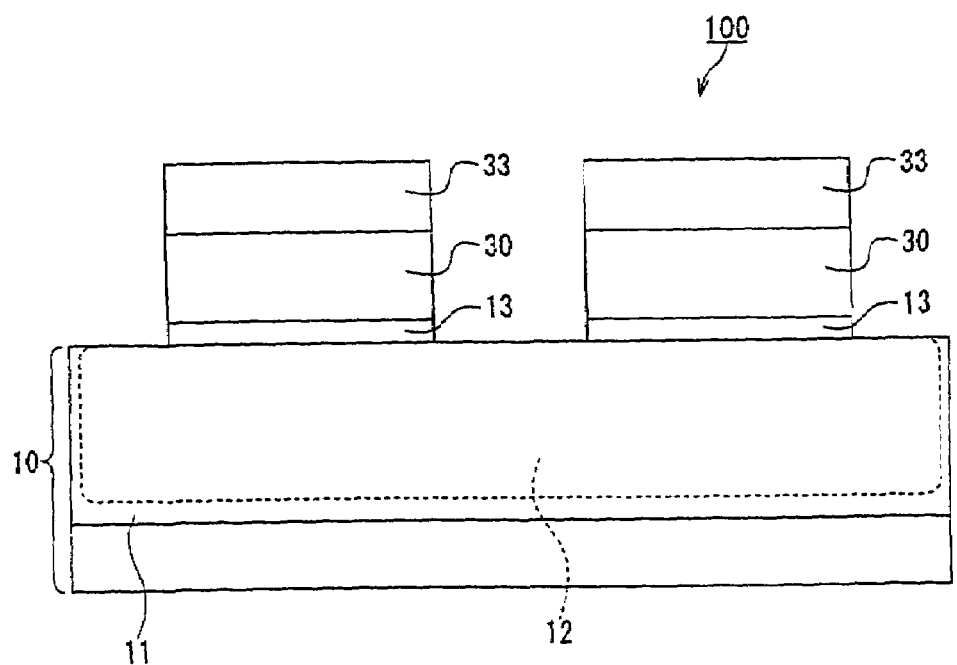
FIG. 8 is a side view of the semiconductor nonvolatile memory cell array of the second embodiment.

In FIG. 8, the separated word lines 33 are laminated on the separated gate electrodes 30. The layer insulation layer is filled between the variable resistance section and the word line so that the distance between the variable resistance section and the word line is so large that the parasitic capacitance between the variable resistance section and the word line becomes small. That is, it is possible to write or read information from the memory cell at high speeds. In addition, the potential change of the word line upon reading information out of the memory cell hardly affects the variable resistance section and the charge storage section on the variable resistance section. Thus, the information once written in the memory cell is hardly read out by accident.

Where word line is formed on the continuous plane of the gate electrode and the layer insulation layer, the junction between the gate electrode and the word line becomes uniform in the direction of the word line. This assures good electrical connection between the gate electrode and the word line, resulting in the reliable information writing and reading operation of the memory cell.

Since the drain and source regions are used as bit lines, there is no need for a bit line wiring layer and contact holes. If contact holes are provided, it is necessary to provide a large distance between the word line and the contact holes to prevent short-circuit between them, resulting in the large memory cell. According to the invention, however, no contact hole is necessary so that it is possible to reduce the memory size.

A process for making the memory cell according to the second embodiment will be described with reference to FIGS. 9 and 10.

Figure 9A:
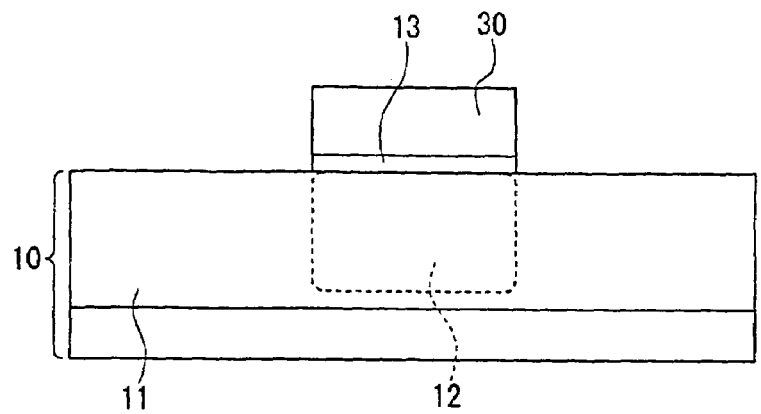
FIGS. 9(A)–(C) and 10(A)–(D) are sectional views of a semiconductor nonvolatile memory cell array being made according to the second embodiment.

First of all, as shown in FIG. 9(A), a p-type impurity is ion-injected into the p-type silicon substrate 10, followed by heat treatment to form a P well 11. The channel forming region 12 within the P well 11 may have a high p-type impurity density to facilitate the generation of hot carriers. Then, a silicon oxide layer (not shown) is formed by thermal oxidation on the surface region of the silicon substrate 10. Then, an impurity, such as phosphor, is doped into the silicon oxide layer to form a polycrystalline silicon layer (not shown). After the formation of the silicon oxide layer and the polycrystalline silicon layer, photolithography and etching are employed for patterning to provide a gate insulation layer 13 and a gate electrode 30. The process for making the gate insulation layer 13 and the gate electrode 30 are well known and their detailed description will be omitted.

Figure 9B:
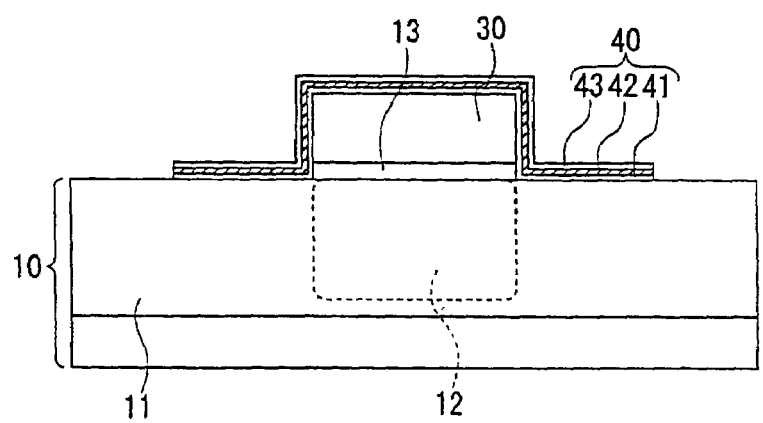

Then, in FIG. 9(B), an ONO laminated body 40 is formed on the P well 11 and the gate electrode 30 to provide a charge storage section. See FIG. 9(B). The ONO laminated body 40 is made up of a bottom silicon oxide layer 41, a silicon nitride layer 42, and a top silicon oxide layer 43. The bottom silicon oxide layer 41 is made by thermal oxidation. The silicon nitride layer 42 is made by chemical vapor deposition (CVD) techniques. The top silicon oxide layer 43 is made by thermal oxidation or CVD techniques. The ONO lamented body 40 may extend over the drain region 21 or the source region 22.

Figure 9C:
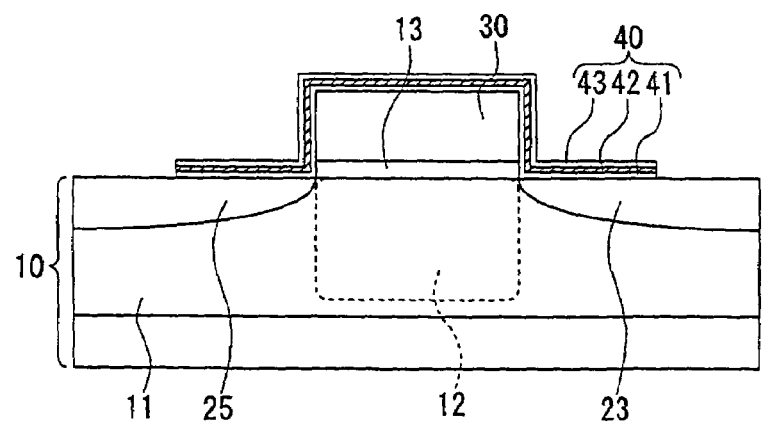

Then, in FIG. 9(c), the first and second impurity low density diffusion sections 23 and 25 are formed by injecting an n-type ion, such as arsenic, followed by heat treatment. The ion acceleration voltage is made so low that the ion just passes through the ONO laminated body 40. Such setting of the acceleration voltage permits the gate electrode 30 and the gate insulation layer 13 to work as a mask so that the impurity is injected into areas other than the channel forming region 12 in the silicon substrate 10. The formation of the first and second impurity low density diffusion sections 23 and 25 may be made prior to or during the formation of the ONO laminated body 40.

Figure 10A:
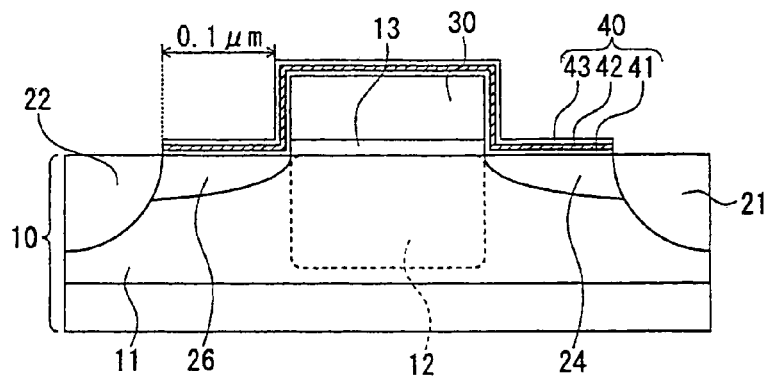

Then, in FIG. 10(A), an area of the surface of the ONO laminated body 40 0.1 µm from the gate electrode 30 is covered with a photoresist (not shown) by the known photolithography technique. An n-type ion, such as arsenic, is then injected by ion injection techniques with the photoresist mask at high densities to form impurity high density diffusion sections in the first and second impurity low density diffusion sections 23 and 25 at a position 0.1 µm from the gate electrode 30. These impurity high density diffusion sections become the drain region 21 and the source region 22. The portions of the first and second impurity low density diffusion sections 23 and 25 adjacent to the gate electrode 30 become the first and second variable resistance sections 24 and 26. The distance of the drain region 21 and the source region 22 from the gate electrode 30, which is 0.1 µm in this embodiment, may be determined by the desired resistance values of the first and second variable resistance sections 24 and 26. After the drain and source regions 21 and 22 are formed, the photoresist is removed. See FIG. (A).

Figure 10B:
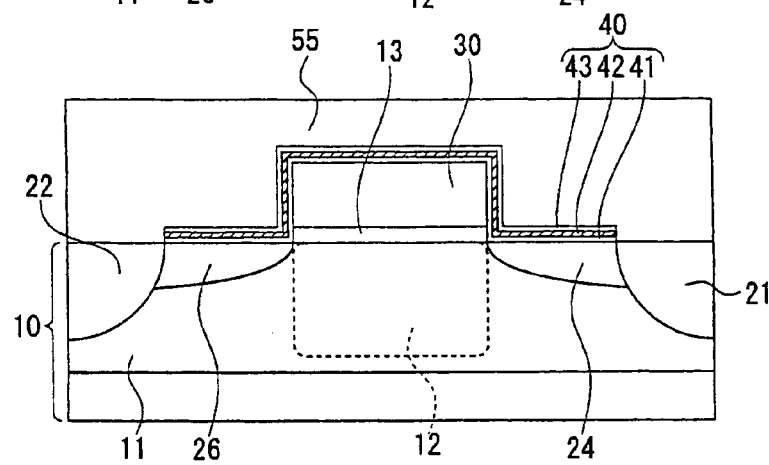

Then, in FIG. 10(B), a layer insulation layer 55 is accumulated on the ONO laminated body 40. The layer insulation layer 55 is made of a silicon oxide layer by CVD techniques, for instance.

Figure 10C:
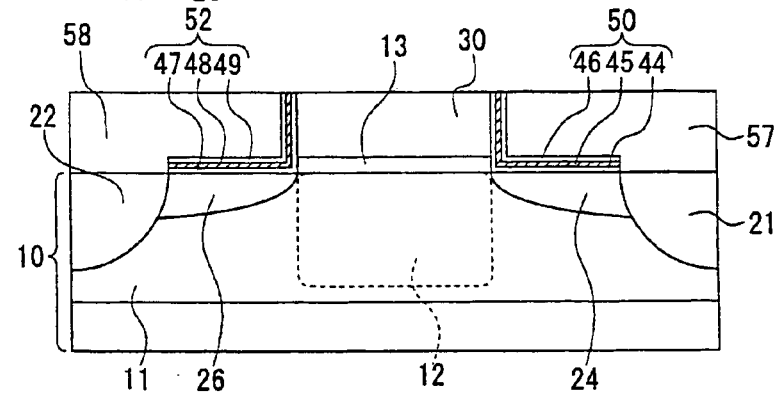

In FIG. 10(C), the top surface of the layer insulation layer 55 is made flat by a suitable polishing technique such as chemical mechanical polishing (CMP). This polishing is made until the top surface of the gate electrode 30 is exposed so that the ONO laminated body 40 is divided into two sections on both sides of the gate electrode 30, providing the first and second charge storage sections 50 and 52. Similarly, the layer insulation layer 55 is divided into the first and second layer insulation layers 57 and 58. The top surface of the gate electrode 30 is flush with the top surfaces of the first and second layer insulation layers 57 and 58, forming a continuous plane.

Figure 10D:
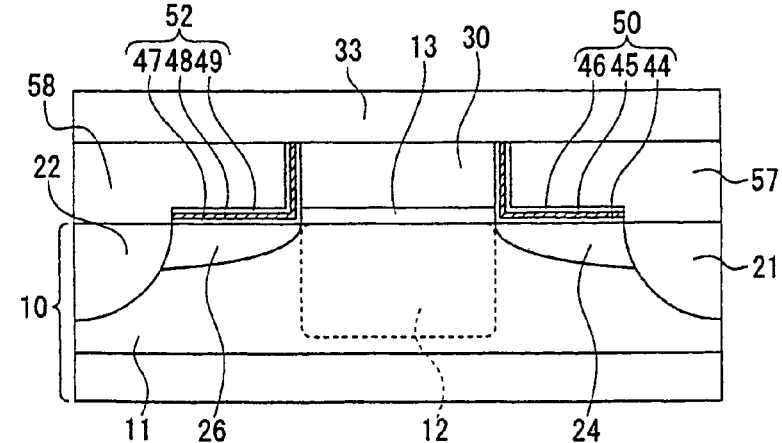

Then, in FIG. 10(D), a wiring layer (not shown) is formed on the gate electrode 30 with tungsten or the like. Then, the word line 33 is formed by patterning the wiring layer, followed by patterning the gate electrode 30. After the gate electrode 30 and the word line 33 are formed by patterning, contact holes and metal wiring are formed for connection with peripheral circuits. Since the drain and source regions 21 and 22 are used as bit lines, a process for making a wiring layer for the bit lines or contact holes for connection between the bit lines and the drain and source regions 21 and 22 is eliminated.

Third Embodiment

The memory cell array according to the third embodiment will be described with reference to FIGS. 11(A) and (B). It is different from the memory cell array according to the first embodiment in FIG. 7 in that the first and second salicide regions 60 and 61 are formed on the surface areas of the drain and source regions 21 and 22. The salicide regions 60 and 61 on the drain and source regions 21 and 22 used as bit lines reduce the bit line resistance, stabilizing the operation of the non-volatile memory cell array.

Figure 11A:
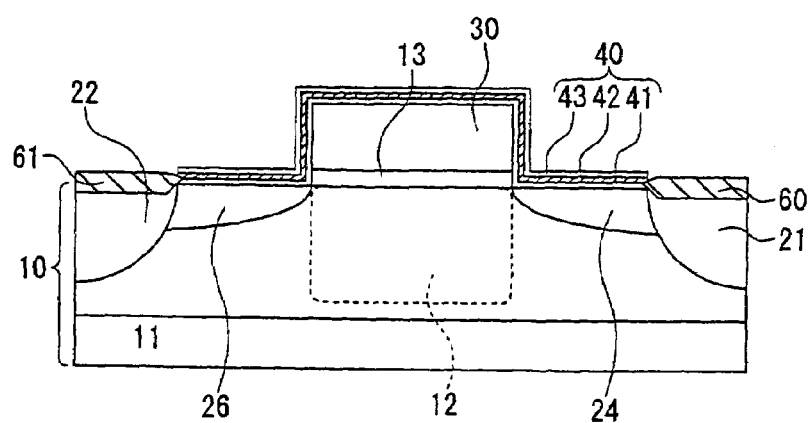
FIGS. 11(A) and (B) are sectional views of a semiconductor nonvolatile memory cell array being made according to the third embodiment of the invention.

In FIG. 11(A), the process up to the manufacture of the drain and source regions 21 and 22 is the same as that of the second embodiment described with reference to FIG. 9(A) through FIG. 10(A) and its description will be omitted. After the drain and source regions 21 and 22 are formed in FIG. 10(A), the first and second salicide regions 60 and 61 of cobalt (Co) or titanium (Ti) are formed. Where the ONO laminated body 40 extends over the drain and source regions 21 and 22, portions of the ONO laminated body 40 on the drain and source regions 21 and 22 are removed and, then, the first and second salicide regions 60 and 61 are formed. The process for forming the first and second salicide regions 60 and 61 are well known and the description will be omitted.

Figure 11B:
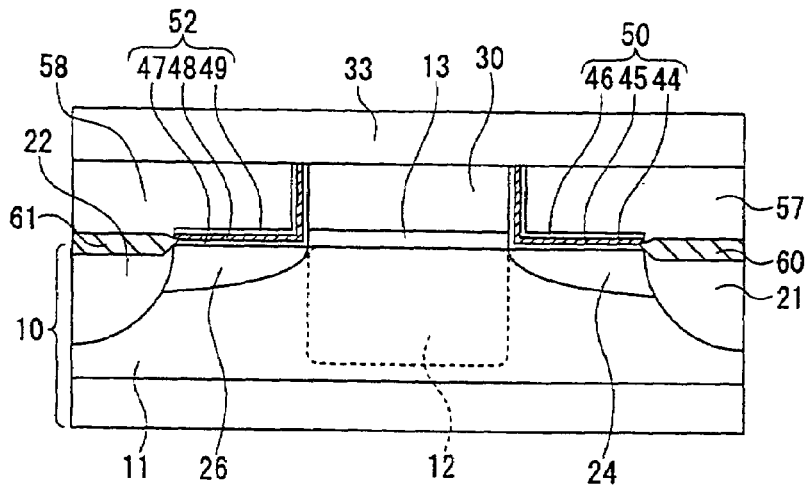

In FIG. 11(B), after the formation of the first and second salicide regions 60 and 61, the first and second layer insulation layers 57 and 58 and the word line 33 are formed to provide a nonvolatile memory cell array. The process after the formation of the first and second salicide regions 60 and 61 is the same as that of the second embodiment described with reference to FIG. 10(B) through (D) and its description will be omitted.

Fourth Embodiment

The memory cell array according to the fourth embodiment will be described with reference to FIGS. 12(A)–(C). It is different from that of the first embodiment in that side wall spacers 14 and 15 are provided on the first and second variable resistance sections 24 and 26. The process up to forming the first and second impurity low density diffusion sections 23 and 25 is the same as that of the second embodiment described with reference to FIGS. 9(A)–(C) and, therefore, its description will be omitted.

Figure 12A:
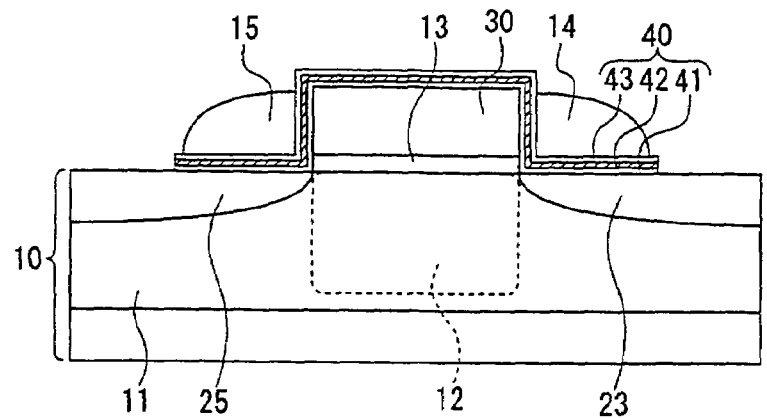
FIGS. 12(A)–(C) are sectional views of a semiconductor nonvolatile memory cell array being made according to the fourth embodiment of the invention.

In FIG. 12(A), after the first and second impurity low density diffusion sections 23 and 25 are formed, the side wall spacers 14 and 15 are formed on the first and second impurity low density diffusion sections 23 and 25. The side wall spacer is formed by accumulating an oxide or nitride layer by CVD techniques or the like, followed by isometric etching. See FIG. 12(A).

Figure 12B:
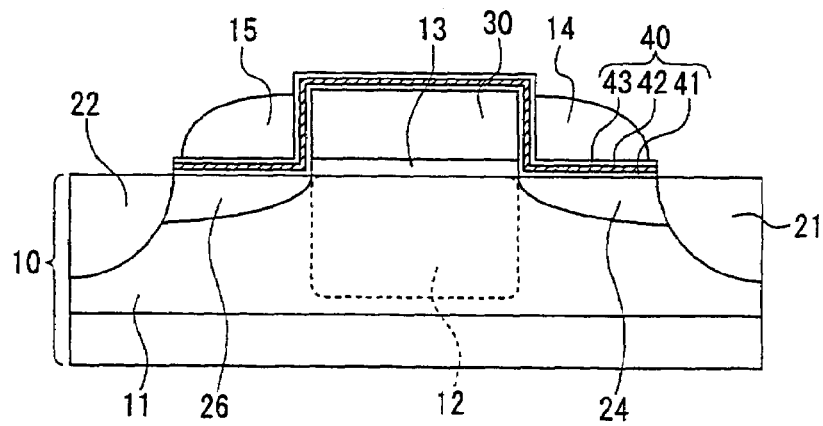
Figure 12C:
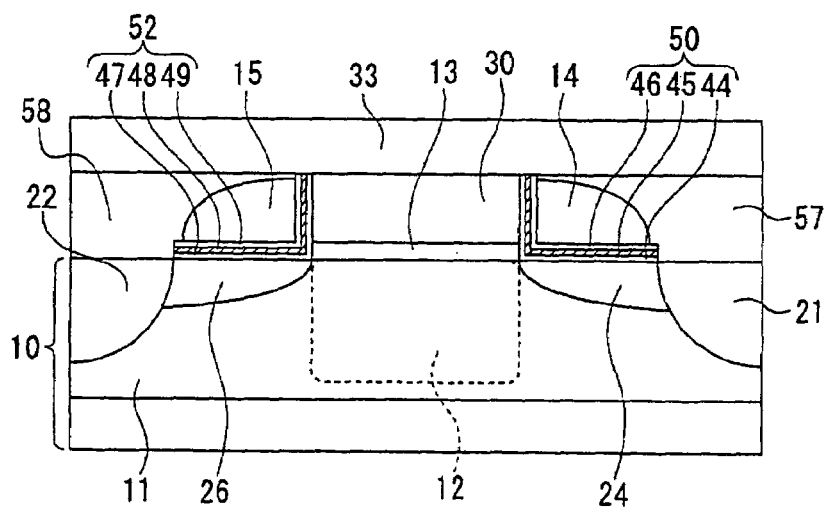

Then, in FIG. 12(B), the ion injection of an impurity is made with masks of the side wall spacers 14 and 15 to form the drain and source regions 21 and 22. See FIG. 12(B). The process after the formation of the drain and source regions 21 and 22 is the same as that of the second embodiment described with reference to FIGS. 10(A)–(D) and, therefore, its description will be omitted.

The same salicide regions as those of the third embodiment may be made after the formation of the drain and source regions 21 and 22. By forming the side wall spacers and ion injecting an impurity with the side wall spacers as masks, it is possible to control variations of and precisely regulate the width of the variable resistance sections. This enables to precisely determine the resistance value of the variable resistance sections, thereby stabilizing the memory operation.

Fifth Embodiment

The memory cell array according to the fifth embodiment will be described with reference to FIGS. 13(A)–(C). It is different from that of the fourth embodiment described with reference to FIG. 12(C) in that the first and second variable resistance sections 24 and 26 are composed of the first and second high density diffusion variable resistance sections 24b and 26b and the first and second low density diffusion variable resistance sections 24a and 26a of which the resistance varies widely. Also, the first side wall spacers 16 and 17 and the second side wall spacers 18 and 19 are provided on the first and second variable resistance sections 24 and 26.

The first and second high density diffusion variable resistance sections 24b and 26b facilitate the injection into the charge storage sections of hot carriers generated upon writing information. The first and second low density diffusion variable resistance sections 24a and 26a have n-type impurity densities lower than those of the first and second high density diffusion variable resistance sections 24b and 26b and resistance values varying more widely than those of the first and second variable resistance sections 24 and 26 in the fourth embodiment. The impurity densities and the region dimensions (width and depth) of the first and second low density diffusion variable resistance sections 24a and 26a and the first and second high density diffusion variable resistance sections 24b and 26b may be set at other suitable values according to the purpose and/or design.

Figure 13A:
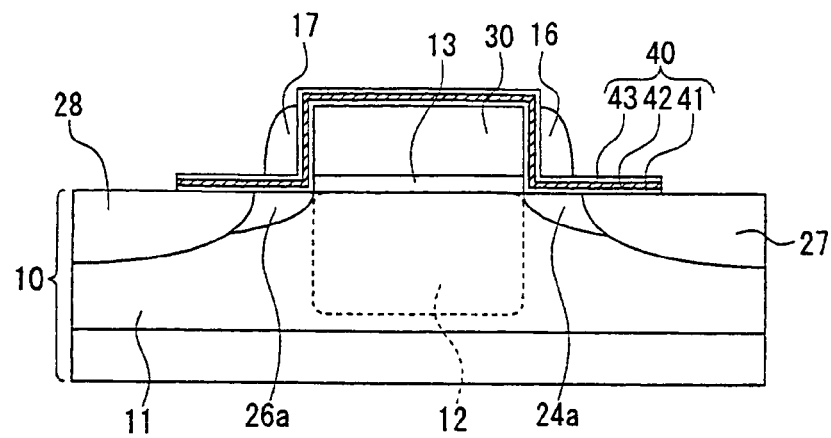
FIGS. 13(A)–(C) are sectional views of a semiconductor nonvolatile memory cell array being made according to the fifth embodiment of the invention.

In FIG. 13(A), the process up to the formation of the first and second impurity low density diffusion sections 23 and 25 is the same as that of the second embodiment described with reference to FIGS. 9(A)–(C) and, therefore, its description will be omitted. After the first and second impurity low density diffusion sections 23 and 25 are formed, the first side wall spacers 16 and 17 are formed. The gate electrode 30, the gate insulation layer 13, and the first side wall spacers 16 and 17 are used as masks for performing ion injection to provide the first and second high density diffusion sections 27 and 28 into which ions have been injected and the first and second low density diffusion variable resistance sections 24a and 26a which have been covered by the first side wall spacers 16 and 17.

Figure 13B:
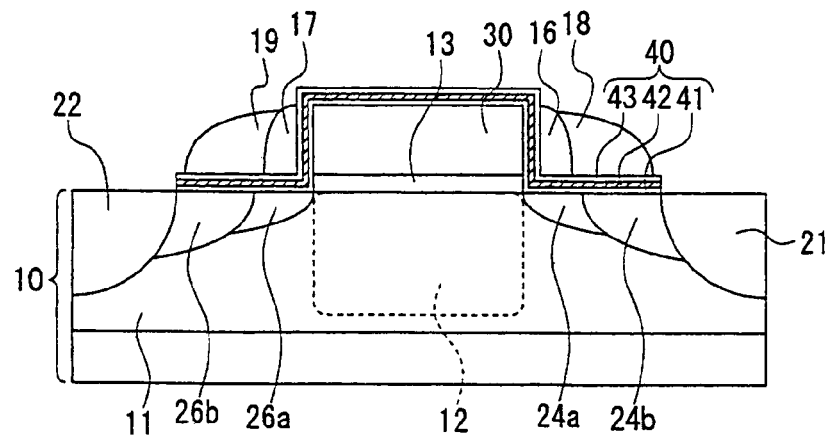
Figure 13C:
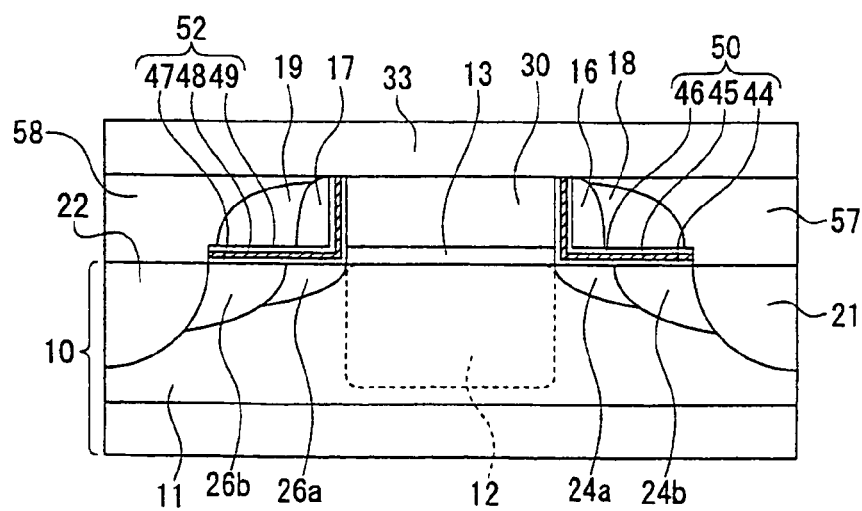

Then, in FIG. 13(B), the second side wall spacers 18 and 19 are formed. The gate electrode 30, the gate oxide layer 13, the first side wall spacers 16 and 17, and the second side wall spacers 18 and 19 are used as masks to perform the ion injection of an impurity, forming the drain and source regions 21 and 22. The areas covered by the second side wall spacers 18 and 19 become the first and second high density diffusion variable resistance sections 24a and 26a having impurity densities higher than those of the first and second low density diffusion variable resistance sections 24a and 26a.

The process after the drain and source regions 21 and 22 are formed is the same as that of the second embodiment described with reference to FIGS. 10(A)–(D) and, therefore, its description will be omitted. Similarly to the third embodiment, the salicide regions may be formed after the formation of the drain and source regions 21 and 22. According to the fifth embodiment, the variable resistance sections are composed of the first and second high density diffusion variable resistance sections 24b and 26b, which facilitate the hot carrier injection, and the first and second low density diffusion variable resistance sections 24a and 26a of which the resistance values vary widely. Since the high and low density diffusion variable resistance sections having different impurity densities are provided, it is possible to make fine adjustment of the resistance variations in the variable resistance sections.

Sixth Embodiment

The memory cell array according to the sixth embodiment will be described with reference to FIGS. 14–16. It comprises thermal oxide layers 65 on the surface area of the drain and source regions 21 and 22 and side wall spacers 14 and 15 on the first and second charge storage section 50 and 52. Since the drain and source regions 21 and 22 are separated from the word line 34 by the thermal oxide layers 65, no layer insulation layers are required. The memory cell array according to the sixth embodiment is made as follows.

Figure 14A:
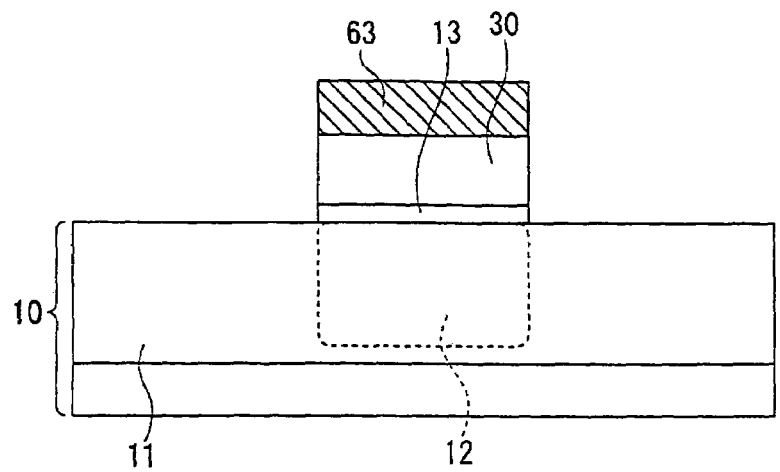
FIGS. 14(A)–(B), 15(A)–(B), and 16 are sectional views of a semiconductor nonvolatile memory cell array being made according to the sixth embodiment of the invention.

First of all, in FIG. 14(A), a p-type impurity is ion injected into the p-type silicon substrate 10, followed by heat treatment to form a P well 11. The p-type impurity density may be made high in the channel forming region 12 to facilitate the generation of hot carriers. Then, a silicon oxide layer is formed by thermal oxidation. Then, an impurity, such as phosphorus, is doped into the silicon oxide layer to form a polycrystalline silicon layer. Photolithography and etching are used for patterning so that the silicon oxide layer and the polycrystalline silicon layer become the gate insulation layer 13 and the gate electrode 30, respectively. A hard mask, such as a mask nitride layer 63, is formed on the gate electrode 30. The process for forming the gate insulation layer and the gate electrode is well known and, therefore, its description will be omitted.

Figure 14B:
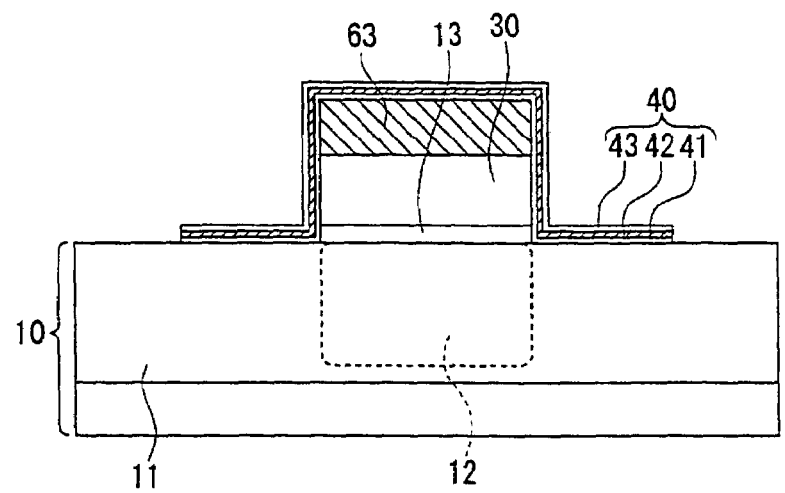

Then, in FIG. 14(B), the ONO laminated body 40 is formed on the P well 11 and the mask nitride layer 63 for making charge storage sections. See FIG. 14(B). The ONO laminated body 40 is composed of the bottom silicon oxide layer 41, the silicon nitride layer 42, and the top silicon oxide layer 43. The bottom silicon oxide layer 41 is made by thermal oxidation. The silicon nitride layer 42 is made by CVD techniques. The top silicon oxide layer 43 is made by thermal oxidation or CVD techniques.

Figure 15A:
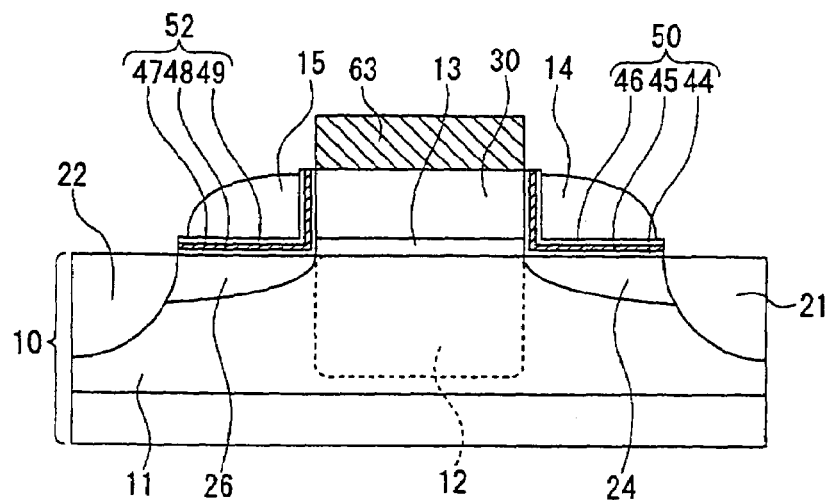

Then, in FIG. 15(A), the first and second impurity low density diffusion sections (not shown) are formed, and the side wall spacers 14 and 15 are formed. Then, the side wall spacers 14 and 15 are used as masks to make impurity ion injection into the first and second impurity low density diffusion sections to form the drain and source regions 21 and 22 and the first and second variable resistance sections 24 and 26. The mask nitride layer 63 on the ONO laminated body 40 is etched by the isometric etching for forming the side wall spacers 14 and 15. The process for forming the drain and source regions 21 and 22 is the same as that of the fourth embodiment described with reference to FIGS. 12(A) and (B) except for providing the mask nitride layer 63 and, therefore, the detailed description will be omitted.

Figure 15B:
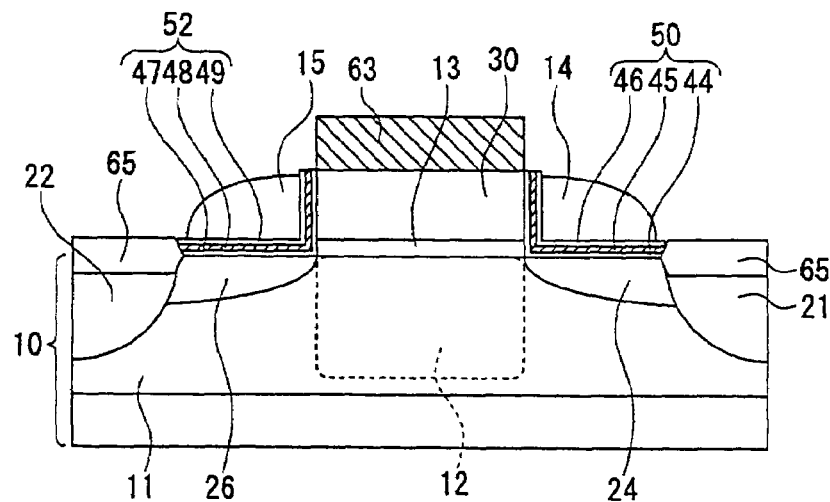

In FIG. 15(B), after the drain and source regions 21 and 22 are formed, thermal oxide layers 65 are formed by thermal oxidation on the drain and source regions 21 and 22. The gate electrode 30 and the first and second variable resistance sections 24 and 26, which are blocked by the mask nitride layer 63 and the silicon nitride layer 45 and 48, are not oxidized.

Figure 16:
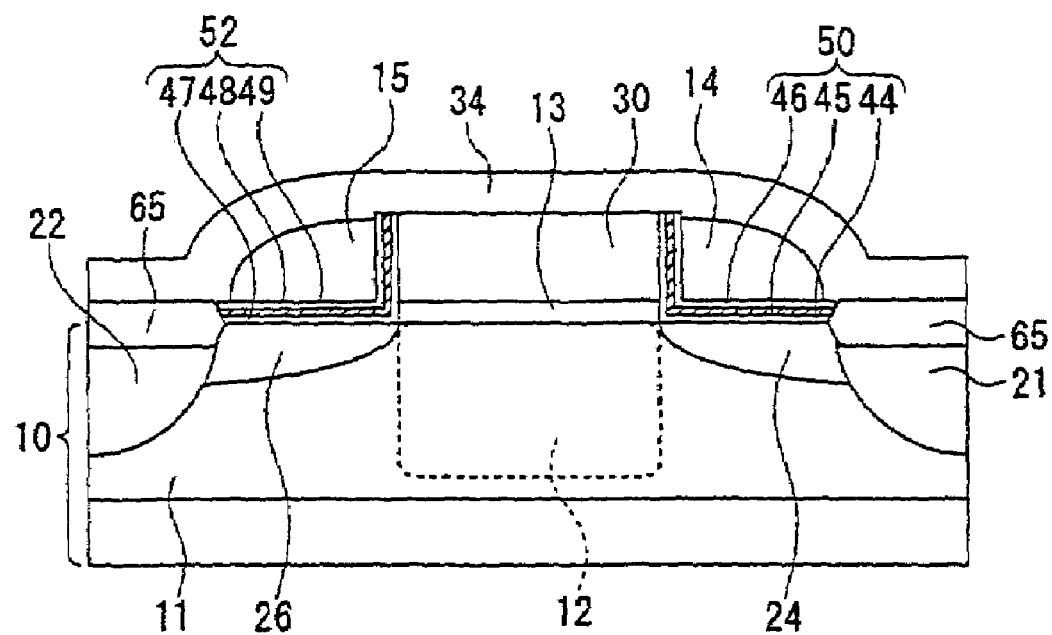

Then, in FIG. 16, only the masking nitride layer 63 is removed with thermal phosphoric acid to form a word line 34. See FIG. 16. The separation by the thermal oxide layer 65 between the word line 34 and the drain and source regions 21 and 22 as bit lines makes it unnecessary to form layer insulation layers. This eliminates the CMP flattening operation, making it possible to form a thin gate electrode. The thin gate electrode facilitates etching the gate electrode 30 and the word line 34 for wiring.

The invention claimed is:

1. A semiconductor nonvolatile memory cell array comprising:
a plurality of semiconductor nonvolatile memory cells, each including:
a semiconductor substrate of a first conductive type;
a control electrode provided on said semiconductor substrate via an insulation layer;

a pair of impurity diffusion regions of a second conductive type provided on said semiconductor substrate on opposite sides of said control electrode to provide first and second main electrodes;

a channel region provided on said semiconductor substrate below said control electrode at a time of transistor operation;

a pair of variable resistance sections of a second conductive type provided between said channel region and said impurity diffusion regions, respectively, and having an impurity density lower than that of said impurity diffusion regions; and a pair of charge storage sections provided one on each of said variable resistance sections;

at least one word line electrically connected to said control electrodes of said semiconductor nonvolatile memory cells;

at least one bit line provided perpendicular to said word line and composed of said impurity diffusion regions; and at least one layer insulation layer provided between said charge storage sections and said word line.

2. The semiconductor nonvolatile memory cell array according to claim 1, wherein a top surface of said control electrode and a top surface of said layer insulation layer constitute a continuous plane on which said word line is provided.

3. The semiconductor nonvolatile memory cell array according to claim 1, wherein said impurity diffusion regions each include a salicide region.

4. The semiconductor nonvolatile memory cell array according to claim 1, which further comprises a pair of side wall spacers provided one on each of said charge storage sections on said variable resistance sections.

5. The semiconductor nonvolatile memory cell array according to claim 4, wherein said variable resistance sections each are composed of a low density diffusion variable resistance section extending from said channel region toward said impurity diffusion region and a high density diffusion variable resistance section having an impurity density higher than that of said low density diffusion variable resistance section and said side wall spacers each are composed of a first side wall spacer provided on said low density diffusion variable resistance section and a second side wall spacer provided on said high density diffusion variable resistance section.

6. A semiconductor nonvolatile memory cell array comprising a plurality of semiconductor nonvolatile memory cells, each including:

a semiconductor substrate of a first conductive type;

a control electrode provided on said semiconductor substrate via an insulation layer;

a pair of impurity diffusion regions of a second conductive type provided on said semiconductor substrate on opposite sides of said control electrode to provide first and second main electrodes;

a channel region provided on said semiconductor substrate below said control electrode at a time of transistor operation;

a pair of variable resistance sections of a second conductive type provided between said channel region and said impurity diffusion regions, respectively, and having an impurity density lower than that of said impurity diffusion regions; and a pair of charge storage sections provided one on each of said variable resistance sections;

at least one word line electrically connected to said control electrodes of said semiconductor nonvolatile memory cells;

at least one bit line provided perpendicular to said word line and composed of said impurity diffusion regions;

a pair of side wall spacers provided one on each of said variable resistance sections; and at least one oxide layer provided on each of said impurity diffusion regions, wherein said word line is provided in contact with a top surface of said control electrode and a top surface of said oxide layer.

* * * * *